(12) United States Patent
Rajasekaran

(10) Patent No.: US 8,724,002 B2
(45) Date of Patent: May 13, 2014

(54) IMAGING PIXELS WITH DUMMY TRANSISTORS THAT REDUCE RESET CHARGE INJECTION

(75) Inventor: Vijay Rajasekaran, Santa Clara, CA (US)

(73) Assignee: Aptina Imaging Corporation, George Town (KY)

( * ) Notice: Subject to any disclaimer, the term of this patent is extended or adjusted under 35 U.S.C. 154(b) by 662 days.

(21) Appl. No.: 13/037,799

(22) Filed: Mar. 1, 2011

(65) Prior Publication Data

US 2012/0218451 A1 Aug. 30, 2012

Related U.S. Application Data

(60) Provisional application No. 61/447,668, filed on Feb. 28, 2011.

(51) Int. Cl.
*H04N 3/14* (2006.01)
*H04N 5/335* (2011.01)
*H04N 5/217* (2011.01)

(52) U.S. Cl.
USPC .......................................... 348/308; 348/241

(58) Field of Classification Search
None
See application file for complete search history.

(56) References Cited

U.S. PATENT DOCUMENTS

| 6,246,436 B1 * | 6/2001 | Lin et al. .................... 348/308 |
| 6,512,544 B1 * | 1/2003 | Merrill et al. ............... 348/302 |
| 6,535,247 B1 | 3/2003 | Kozlowski et al. |
| 7,352,400 B2 * | 4/2008 | Sakurai et al. .............. 348/308 |
| 7,619,671 B2 | 11/2009 | Li et al. |
| 7,801,384 B2 | 9/2010 | Findlater et al. |
| 2004/0217398 A1 * | 11/2004 | Lee .............................. 257/292 |
| 2009/0190018 A1 * | 7/2009 | Sakakibara ................... 348/308 |

OTHER PUBLICATIONS

Razavi, "12.2.3 Precision Consideration," "12.2.4 Charge Injection Cancellation," "Design of Analog CMOS Integrated Circuits," Aug. 2000, pp. 417-423.

* cited by examiner

*Primary Examiner* — Justin P Misleh
(74) *Attorney, Agent, or Firm* — Treyz Law Group; David C. Kellogg

(57) ABSTRACT

An imaging system may include imaging pixels. Each imaging pixel may include a reset transistor and a dummy transistor coupled to a floating diffusion storage node. When reset signals control are deasserted, capacitive coupling between the gate terminal of the reset transistor and the source-drain terminals of the reset transistor may lead to reset charge injection. The dummy transistor may have both of its source-drain terminals shorted together and shorted to the floating diffusion region. Dummy control signals, which may be provided by separate dummy control lines or may be provided using row-select signals, may be asserted on the dummy transistors at approximately the same time that the reset signals are deasserted. With arrangements of this type, the dummy control signals may inject an approximately equal and opposite charge onto the floating diffusion region, thereby reducing the reset charge injection caused by deasserting the reset control signals.

15 Claims, 7 Drawing Sheets

IMAGING PIXELS WITH DUMMY TRANSISTORS THAT REDUCE RESET CHARGE INJECTION

This application claims the benefit of provisional patent application No. 61/447,668, filed Feb. 28, 2011, which is hereby incorporated by reference herein in its entirety.

BACKGROUND

This relates to imaging systems and, more particularly, to imaging pixels with dummy transistors that reduce reset charge injection.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

With typical image sensing pixels, capacitive coupling between the gate terminal of a reset transistor and the source-drain terminals of that reset transistor leads to reset charge injection. On the falling edge of a reset clock applied to the gate terminal of the reset transistor, this capacitive coupling pulls down the voltage on the pixel's floating diffusion node. The lowered voltage on the floating diffusion node limits the available voltage swing of the pixel. Because of these effects, the dynamic range of typical image sensing pixels is reduced.

It would therefore be desirable to provide imaging pixels that exhibit reduced reset charge injection effects.

DETAILED DESCRIPTION

Figure 1:
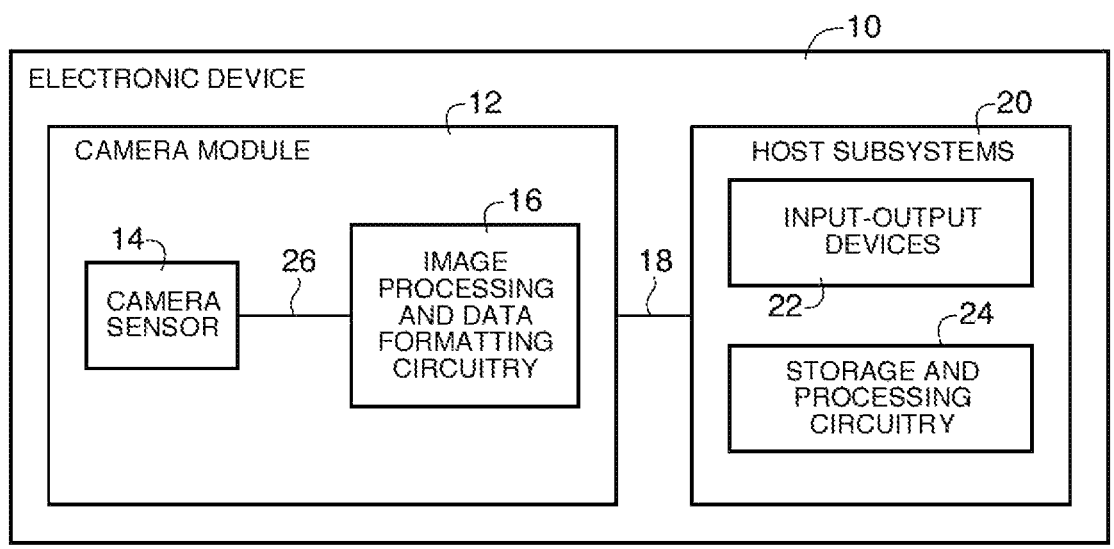
FIG. 1 is a diagram of an illustrative electronic device that may include an imager that includes imaging pixels with dummy transistors that reduce reset charge injection in accordance with an embodiment of the present invention.

An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

Figure 2:
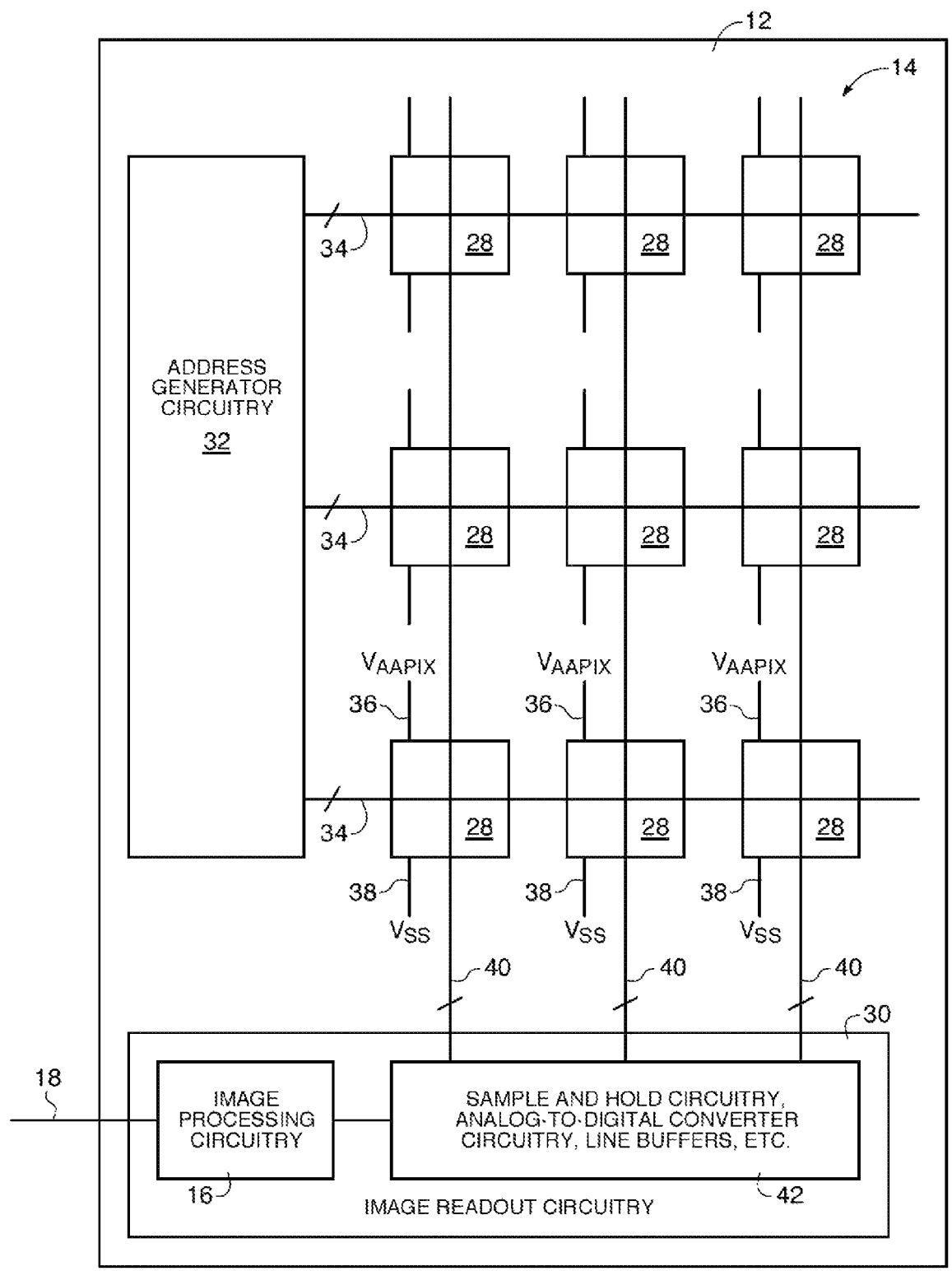
FIG. 2 is a diagram of an illustrative array of light-sensitive pixels and control circuitry coupled to the array of pixels in accordance with an embodiment of the present invention.

An example of an arrangement for sensor array 14 is shown in FIG. 2. As shown in FIG. 2, device 10 may include an array 14 of pixels 28 coupled to image readout circuitry 30 and address generator circuitry 32. As an example, each of the pixels in a row of array 14 may be coupled to address generator circuitry 32 by one or more conductive lines 34. Array 14 may have any number of rows and columns. In general, the size of array 14 and the number of rows and columns in array 14 will depend on the particular implementation. While rows and columns are generally described herein as being horizontal and vertical rows and columns may refer to any grid-like structure (e.g., features described herein as rows may be arranged vertically and features described herein as columns may be arranged horizontally).

Address generator circuitry 32 may generate signals on paths 34 as desired. For example, address generator circuitry 32 may generate reset signals on reset lines in paths 34, transfer signals on transfer lines in paths 34, and row select (e.g., row readout) signals on row select lines in paths 34 to control the operation of array 14. If desired, address generator circuitry 32 and array 14 may be integrated together in a single integrated circuit (as an example).

Address generator circuitry 32 may, if desired, generate signals for dummy transistors in the imaging pixels 28 of array 14. These signals may be generated to offset (e.g., reduce) charge injection resulting from signals used in the operation of imaging array 14. For example, address generator circuitry 32 may generate reset signals for reset transistors in array 14 and may generate corresponding dummy reset signals. As the reset signals shift from logic high to logic low (or vice-versa), capacitive coupling (e.g., parasitic capacitance) between the gate terminals of the reset transistors and the source-drain terminals of the reset transistors may result in undesirable charge injection. The dummy signals generated by circuitry 32 may be applied to dummy transistors to offset the reset charge injection (e.g., by injecting an approximately equal and opposite amount of charge). Circuitry 32 may, if desired, generate dummy signals other than reset signals, such as dummy transfer signals.

Image readout circuitry 30 may include circuitry 42 and image processing and data formatting circuitry 16. Circuitry 42 may include sample and hold circuitry, analog-to-digital converter circuitry, and line buffer circuitry (as examples). As one example, circuitry 42 may be used to measure signals in pixels 28 and may be used to buffer the signals while analog-to-digital converters in circuitry 42 convert the signals to digital signals. In a typical arrangement, circuitry 42 reads signals from rows of pixels 28 one row at a time over lines 40. The digital signals read out by circuitry 42 may be representative of charges accumulated by pixels 28 in response to incident light. The digital signals produced by the analog-to-digital converters of circuitry 42 may be conveyed to image processing and data formatting circuitry 16 and then to host subsystem 20 (FIG. 1) over path 18.

Figure 3:
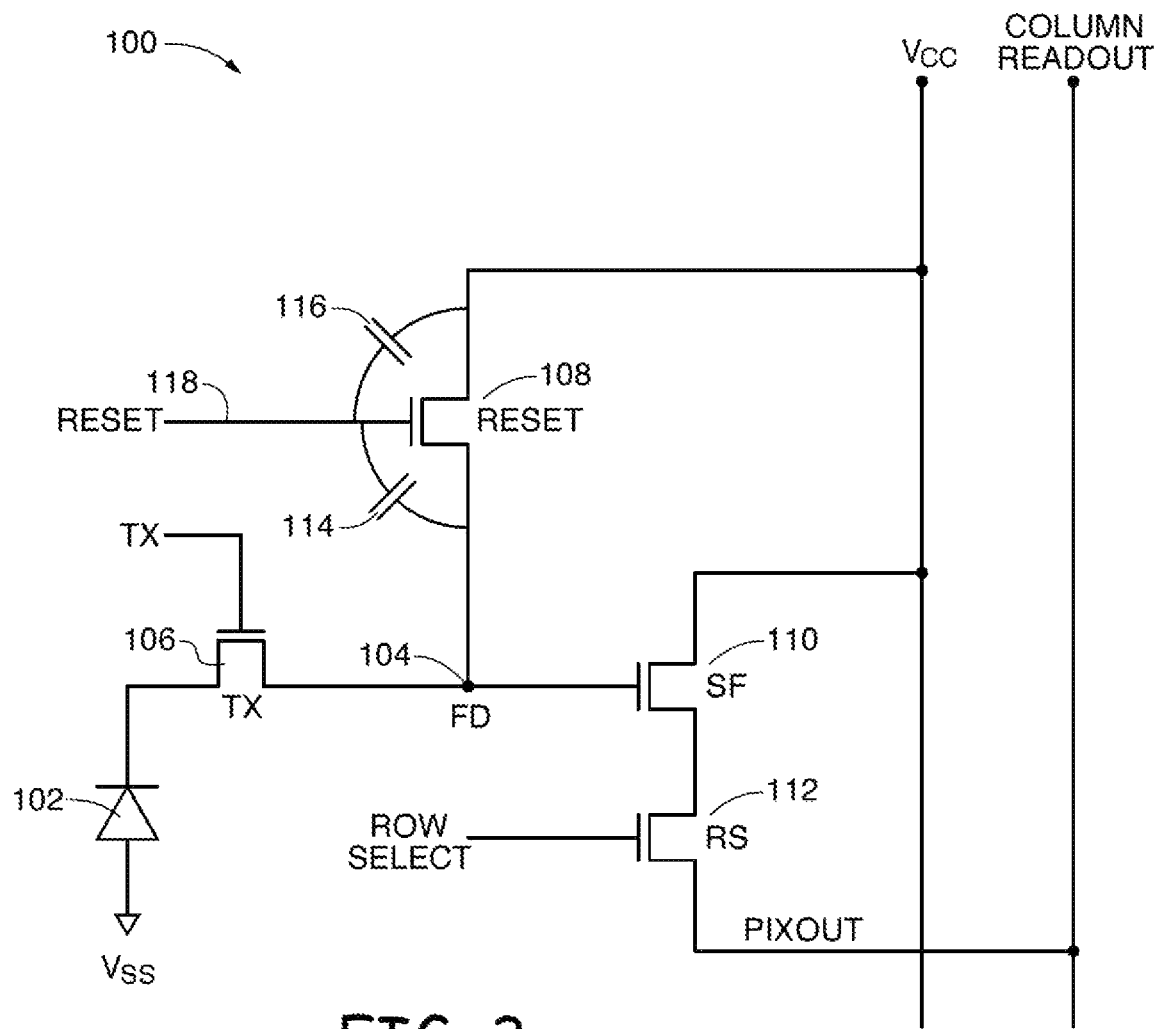
FIG. 3 is a diagram of a conventional imaging pixel that exhibits reset charge injection effects.

A conventional image sensing pixel is shown in FIG. 3. As shown in FIG. 3, conventional image sensing pixel 100 includes photosensor 102, floating diffusion node 104, transfer transistor 106, reset transistor 108, source-follower transistor 110, and row-select transistor 112.

As illustrated schematically by capacitors 114 and 116, the gate terminal of reset transistor 108 is capacitively coupled to each of the source-drain terminals of the reset transistor 108. Due to these capacitive couplings (e.g., parasitic capacitances), conventional imaging pixel 100 is subject to reset charge injection that limits the available voltage swing of the pixel 100, which limits the dynamic range of the pixel 100.

Reset charge injection occurs on the falling edge of a reset control signal applied to the gate of the reset transistor 108. During a reset operation, a reset control signal at a logic high level (e.g., Vcc) turns reset transistor 108 on. When reset transistor 108 is turned on, floating diffusion node 104 is connected to a Vcc power supply line, thereby discharging any charge accumulated on floating diffusion node 104. As the reset control signal shifts to a logic low level (e.g., a ground power supply level Vss), reset transistor 108 is turned off, thereby isolating floating diffusion node 104 from the Vcc power supply line. Due to capacitive coupling effects, reset charge injection occurs and the voltage on floating diffusion node 104 is pulled down. In particular, the capacitive coupling illustrated by capacitor 114 causes the voltage on node 104 to by pulled down somewhat by the dropping voltage on reset control line 118.

Figure 4:
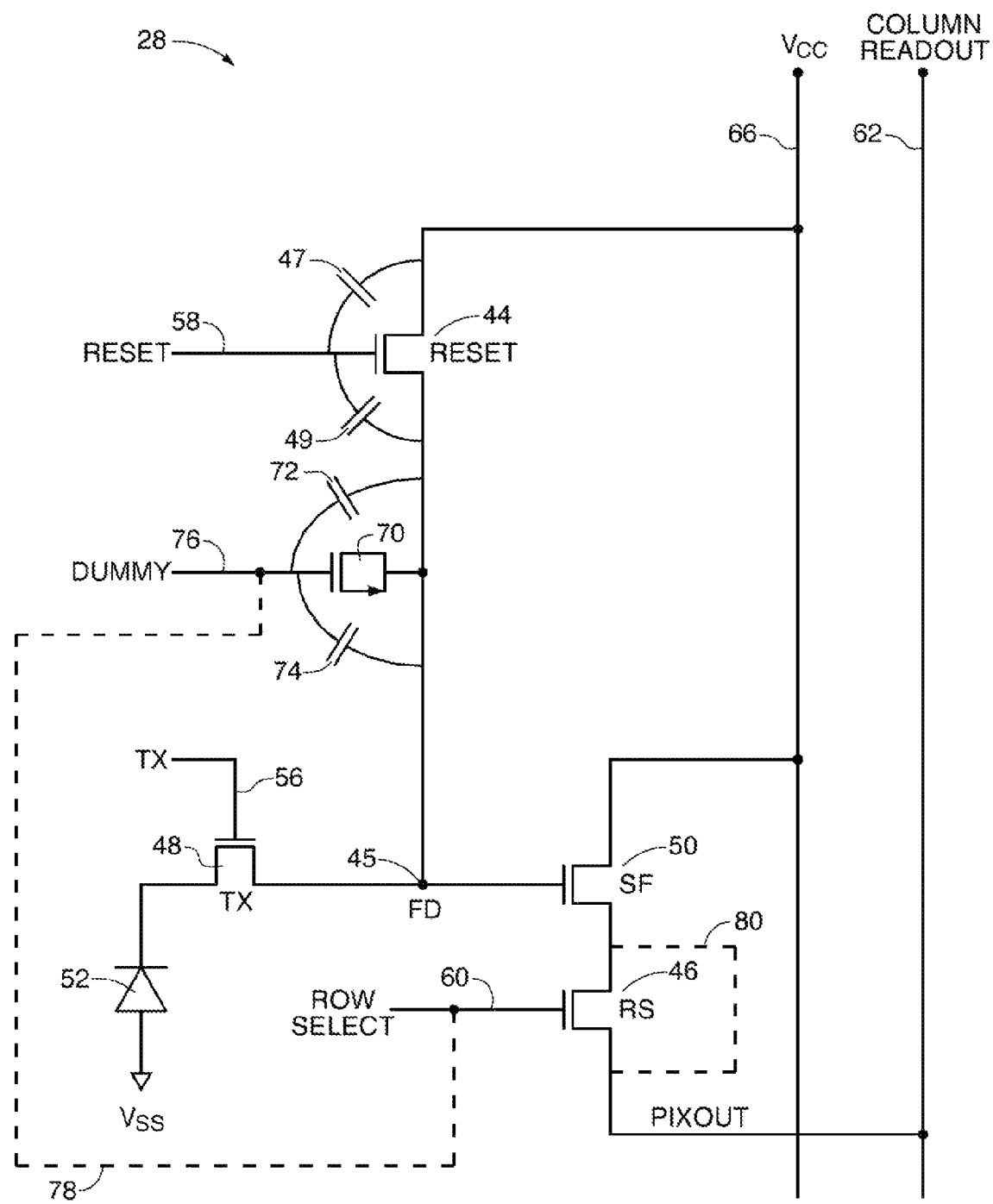
FIG. 4 is a diagram of an illustrative light-sensitive pixel that may include dummy transistors that reduce or eliminate reset charge injection in accordance with an embodiment of the present invention.

A diagram of an image sensing pixel 28 that may be used in array 14 of FIG. 2 is shown in FIG. 4. As shown in FIG. 4, each pixel 28 of array 14 may include transistors such as reset transistor 44, row select transistor 46, transfer gate 48 (e.g., transfer transistor 48), and source-follower transistor 50 (e.g., a driver in pixel 28). Pixel 28 may include a photosensitive device such as photodiode 52 (sometimes referred to herein as a photosensitive element). In general, it is desirable to maximize the light collecting area of photosensitive device 52 relative to the total area of each pixel 28. This type of arrangement helps to maximize the sensitivity of each pixel 28 (and sensor 14) to incident light.

The photosensitive device in each pixel 28 of array 14 can accumulate charge in response to incident light (e.g., light which strikes photosensitive device 52). The time between a reset operation in which the accumulated charge is reset and a readout operation or a transfer operation (in which the accumulated charge is shifted to a storage element such as floating diffusion node FD) is sometimes referred to herein as an integration time or an exposure time. The accumulated charge generated by photosensitive device 52 may be proportional to the intensity of the incident light and the integration time. Relatively long integration times may be used to capture scenes with relatively low intensities (e.g., to ensure that the accumulated charge is sufficient to overcome noise in array 14) and relatively short integration times may be used to capture scenes with relatively high intensities (e.g., to ensure that the accumulated charge does not reach a saturation point).

Reset transistor 44 can be used to reset pixel 28. During reset operations, reset transistor 44 may be turned on by reset signals on reset line 58. When reset signals (RESET) on reset line 58 are asserted, transistor 44 may be turned on and may allow accumulated charge on floating diffusion node 45 to flow into a power supply line (e.g., through power supply terminal 66). In one embodiment, transfer signals (TX) on transfer line 56 may also be asserted during reset operations, such that the charges on both photosensitive element 52 and floating diffusion node 45 are reset.

Transfer gate 48 may be controlled by transfer line 56. When transfer signals (TX) on transfer line 56 are asserted, gate 48 may be turned on and may allow accumulated charge from photodiode 52 to flow to other transistors in pixel 28 or to a storage element such as floating diffusion node 45. Reset transistor 44 may be turned on when transfer gate 48 is turned on so that the accumulated charge from photodiode 52 flows to line 66. Transfer gate 48 may be turned on prior to a readout operation to allow the accumulated charge from photodiode 52 to flow to floating diffusion node 45. Transfer gate 48 may be turned on during a readout operation to allow the accumulated charge from photodiode 52 to flow to the gate of source-follower transistor 50.

Source-follower transistor 50 and row select transistor 46 may be used during a readout operation of pixel 28. Row select transistor 46 may be controlled by row select (ROW SELECT) signals on line 60. Source-follower transistor 50 may be coupled between a power supply line such as line 66 and row select transistor 46. Source-follower transistor 50 may be controlled by the accumulated charge generated by the photodiode 52 (which may be stored in diffusion node 45). When row select signals on line 60 are asserted, transistor 46 may be turned on, while the accumulated charge transferred from the photodiode 52 is used to control transistor 50. The voltage that the accumulated charge applies to the gate of transistor 50 determines the voltage of column readout (COULUMN READOUT) line 62. Image readout circuitry 30 of FIG. 2 may then determine the voltage of the accumulated charge in pixel 28 by sampling the voltage of line 62. If desired, image readout circuitry 30 may utilize a correlated double sampling technique in which the reset level of pixel 28 is also measured and the reset level is subtracted from the image signal level (e.g., the voltage of the accumulated charge in pixel 28).

With imaging pixel arrangements of the type shown in FIG. 4 and with other arrangements, capacitive coupling between the gate terminal of reset transistor 44 and the source-drain terminals of reset transistor, as illustrated schematically by capacitors 47 and 49, may result in undesirable reset charge injection. With one suitable arrangement, image sensing pixel 28 may include one or more dummy transistors such as dummy transistor 70 that may be used to reduce or eliminate the reset charge injection (e.g., by injecting an approximately equal and opposite amount of charge). Dummy transistor 70 may have both of its source-drain terminals connected together (e.g., such that there is no channel under the dummy poly of transistor 70). If desired, dummy transistor 70 may have a body terminal connected to the source-drain terminals of dummy transistor 70. The source-drain terminals of dummy transistor 70 may be connected to floating diffusion node 45.

As illustrated schematically by capacitors 72 and 74, there may be capacitive coupling (e.g., parasitic capacitance) between the gate terminal of dummy transistor 70 and the shorted-together source-drain terminals of the dummy transistor 70. With this type of arrangement, dummy signals (DUMMY) may be generated by address generator circuitry 32 and applied to dummy transistor 70 over control lines such as control line 76. By applying a rising edge of a dummy signal to dummy transistor 70 at approximately the same time as applying a falling edge of a reset signal to reset transistor 44, reset charge injection attributable to reset transistor 44 may be offset by charge injection attributable to dummy transistor 70.

With one suitable arrangement, the dummy signals produced by circuitry 32 and applied to dummy transistor 70 may mirror reset signals produced by circuitry 32 and applied to reset transistor 44 (e.g., the dummy signals may be the inverse of the reset signals). With arrangements of this type, separate dummy control lines may be used to convey the dummy signals from circuitry 32 to the imaging pixels 28 of array 14.

With another suitable arrangement, dummy transistor 70 may receive control signals over row select line 60, as illustrated by dashed line 78. With arrangements of this type, the timing of row select signals on row select line 60 may, if desired, be shifted to more closely mirror reset signals on reset control line 58. In particular, the rising edge of the row select signals on line 60 may be timed to overlap with the falling edge of the reset signal on line 58.

If desired, row select transistor 46 may be omitted from imaging pixels 28 of array 14, as illustrated by dashed line 80. With arrangements of this type, control line 60 may be used in providing dummy signals to dummy transistor 70.

Figure 5A:
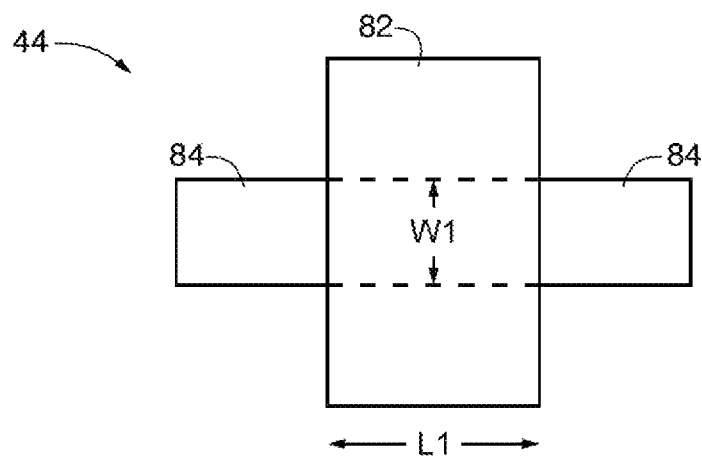
FIG. 5A is a top view of an illustrative reset transistor in accordance with an embodiment of the present invention.
Figure 5B:
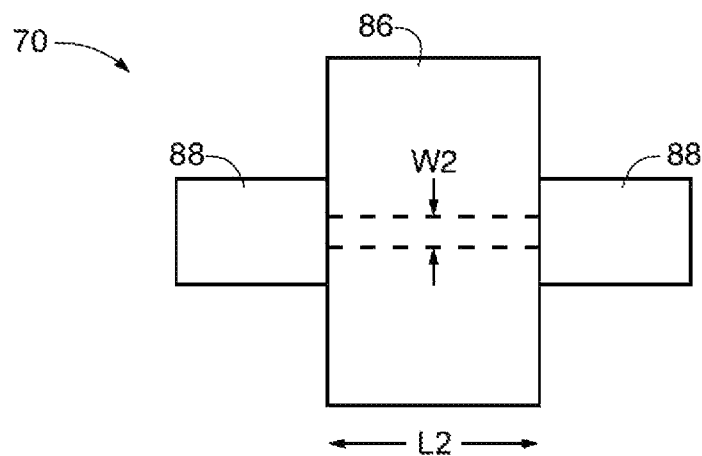
FIG. 5B is a top view of an illustrative dummy transistor in accordance with an embodiment of the present invention.

As shown in FIGS. 5A and 5B, reset transistor 44 may include gate region 82 and source-drain regions 84 and dummy transistor 70 may include gate region 86 and source-drain regions 88. Transistors 44 and 70 have conductive channels between their source-drain regions and their gate terminals. In reset transistor 44, the conductive channel between the source-drain regions 84 and the gate terminal 82 of reset transistor 44 has a width W1 and a length L1. In dummy transistor 70, the conductive channel between the source-drain regions 88 and the gate terminal 86 of dummy transistor 70 has a width W2 and a length L2.

The amount of charge injection supplied by a transistor may vary as a function of the width and length of the channel underneath the gate polysilicon of that transistor. Because of this relationship, it may be desirable to optimize the widths and lengths of the conductive channels of dummy transistor 70 and reset transistor 44 such that the capacitive coupling charge injection of dummy transistor 70 approximately (or entirely) offsets the capacitive coupling charge injection of reset transistor 44. In general, varying the width of conductive channel of dummy transistor 70 may have a larger effect on the magnitude of the charge injection of transistor 70 than varying the length of the conductive channel of dummy transistor 70.

As shown in the schematic of FIG. 4, charge injection through reset transistor 44 may be approximately split between the two source-drain terminals of reset transistor 44. As a consequence, only the charge injected through illustrative capacitor 49 may actually effect the operation of imaging pixel 28 (e.g., by altering the voltage on floating diffusion node 45). In contrast, approximately all of the charge injected through dummy transistor 70, although split between the two source-drain terminals of dummy transistor 70, may affect the operation of imaging pixel 28 (e.g., by altering the voltage on floating diffusion node 45). For at least these reasons, it may be desirable to form transistors 44 and 70 such that the capacitance of capacitor 49 is approximately equal to the sum of the capacitances of capacitors 72 and 74. With arrangements of this type, the charge injected into floating diffusion node 45 by reset transistor 44 may be approximately offset by charge injected by dummy transistor 70. As one example, dummy transistor 70 and reset transistor 44 may be formed such that width W2 is approximately half of width W1 and lengths L1 and L2 are approximately equal (e.g., so that charge injected through illustrative capacitors 72 and 74 approximately cancels charge injected through illustrative capacitor 49).

Figure 6:
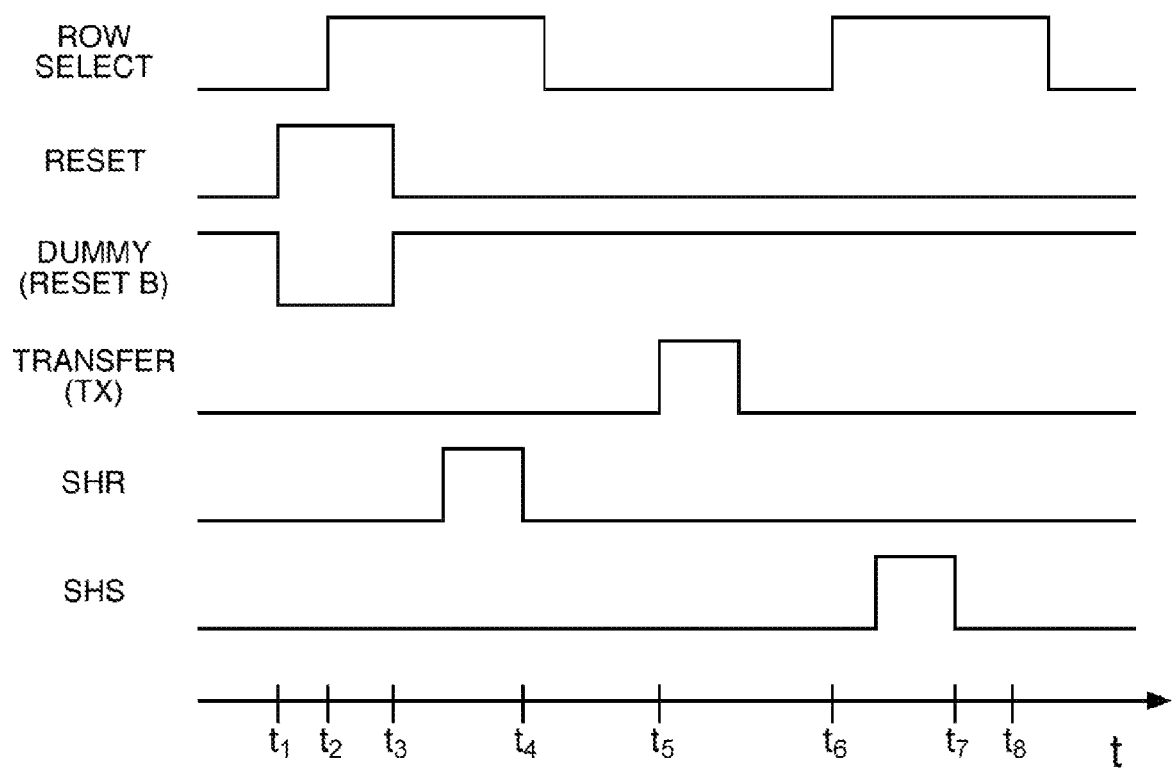
FIG. 6 is a graph of illustrative signals that may be used in reading image data out of an imaging pixel of the type shown in FIG. 4 in which a dummy transistor receives dummy control signals in accordance with an embodiment of the present invention.

A graph of the values of various potential signals that may be used during imaging operations (e.g., image capture and image readout operations) is shown in FIG. 6. FIG. 6 illustrates signals that may be used in reading imaging data out of imaging pixels such as pixel 28 of FIG. 4, in arrangements in which pixel 28 includes a dummy transistor such as transistor 70 that receives dedicated control signals such as dummy control signals over control line 76.

At time $t_1$, reset signals RESET may be asserted (e.g., taken to a logic high state, which may be a positive power supply voltage Vcc). Reset signals RESET may be asserted on one row (or multiple rows) of image sensing pixels 28 in sensor 14 and may activate the reset transistors 44 of the pixels in that row. With one suitable arrangement, dummy signals DUMMY may be deasserted at $t_1$. Dummy signals DUMMY may sometimes be referred to herein as inverted reset signals (e.g., RESET_B).

At time $t_2$, row-select signals ROW SELECT may be asserted. Row-select signals may be asserted on the same row addressed by reset signals RESET (at time $t_1$) and may activate the row-select transistors 46 of the pixels 28 in that row.

At time $t_3$, reset signals RESET may be deasserted and dummy signals DUMMY may be asserted. By asserting dummy signals DUMMY at approximately the same time that reset signals RESET are deasserted, reset clock feed through (e.g., reset charge injection) may be reduced (e.g., reduced, minimized, or eliminated), as described in connection with FIG. 4.

At time $t_4$, sample and hold reset signals (SHR) may be asserted. When sample and hold reset signals are asserted, sample and hold circuitry 42 (FIG. 2) for each column of sensor 14 may sample and hold reset signals from each of the pixels in the currently-selected row (e.g., from the pixels in the row addressed by reset signals RESET and row-select signals ROW SELECT). If desired, the sample and hold circuitry may sample the reset signals when the sample and hold reset signals are deasserted (e.g., upon the falling edge of the SHR signals).

At time $t_5$, transfer signals TX may be asserted. Transfer signals TX may be asserted on the same row addressed by row-select signals ROW SELECT (at time $t_2$) and may activate the transfer transistors 48 of the pixels in that row. With transfer transistors 48 activated, charge accumulated by photosensor 52 may be transferred to floating diffusion storage node 45. The accumulated charge on floating diffusion storage node 45 may then be conveyed to the gate terminal of source-follower transistor 50 and output to column readout line 62 by source-follow transistor 50 (through the activated row-select transistor 46).

At time $t_6$, sample and hold image signals (SHS) may be asserted. When sample and hold image signals are asserted, sample and hold circuitry 42 (FIG. 2) may sample and hold image signals from each of the pixels in the currently-selected row (e.g., the voltages on floating diffusion nodes 45 which have been shifted from reset values by the accumulated image charges from photodiodes 52). If desired, sample and hold circuitry 42 may sample the image signals when the sample and hold image signals are deasserted (e.g., upon the falling edge of the SHS signals). In some embodiments, the sample and hold circuitry may use the reset signals in reducing noise from the image signals (e.g., by subtracting the reset signals from the image signals in a correlated double sampling image readout scheme).

At time $t_8$, row-select signals ROW SELECT may be deasserted, thereby disconnecting the selected row from column readout circuitry such as circuitry 42 of image readout circuitry 30 (FIG. 2).

Following time $t_8$, the signals of FIG. 6 may be applied to subsequent rows of pixels 28 in sensor 14 (e.g., to read out all of the rows of pixels 28 using an electronic rolling shutter technique).

Figure 7:
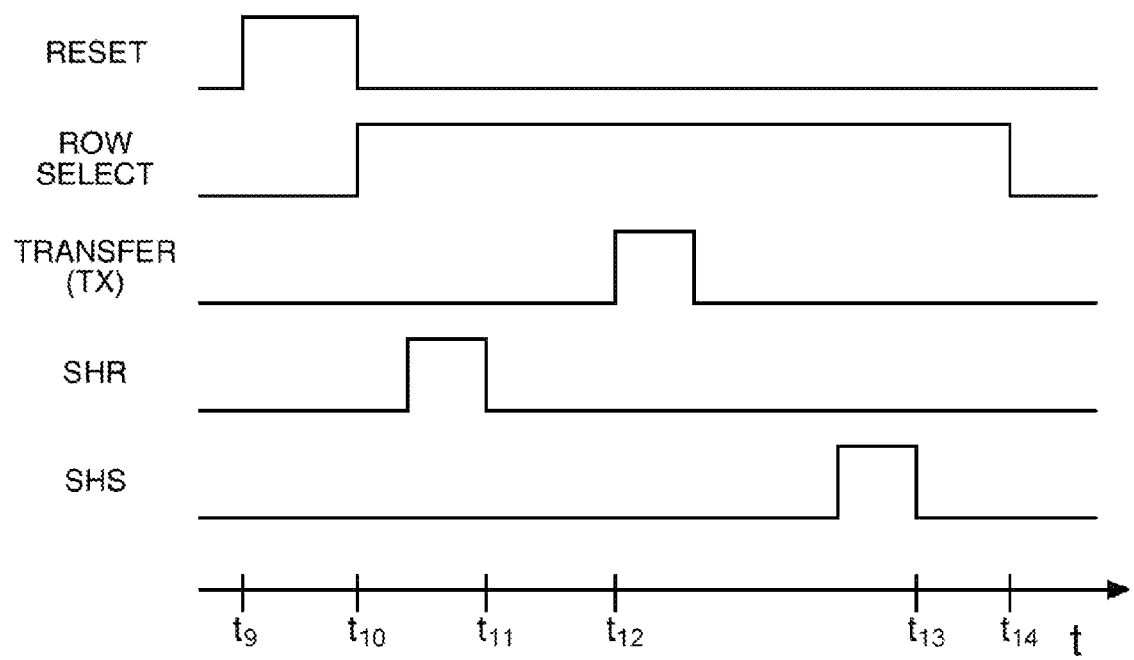
FIG. 7 is a graph of illustrative signals that may be used in reading image data out of an imaging pixel of the type shown in FIG. 4 in which a dummy transistor receives row select control signals in accordance with an embodiment of the present invention.

A graph of the values of various potential signals that may be used during imaging operations (e.g., image capture and image readout operations) is shown in FIG. 7. FIG. 7 illustrates signals that may be used in reading imaging data out of imaging pixels such as pixel 28 of FIG. 4, in arrangements in which row select signals on a row select line such as control line 60 in pixel 28 control a dummy transistor such as transistor 70 in pixel 28.

At time $t_9$, reset signals RESET may be asserted (e.g., taken to a logic high state, which may be a positive power supply voltage Vcc). Reset signals RESET may be asserted on one row (or multiple rows) of image sensing pixels 28 in sensor 14 and may activate the reset transistors 44 of the pixels in that row.

At time $t_{10}$, reset signals RESET may be deasserted and row-select signals ROW SELECT may be asserted. Row-select signals may be asserted on the same row addressed by reset signals RESET (at time $t_9$) and may activate the row-select transistors 46 of the pixels 28 in that row. In arrangements in which dummy transistor 70 receives control signals over row select line 60, as illustrated by dashed line 78 in FIG. 4, row-select signals ROW SELECT may be applied to the gate terminal of dummy transistor 70. By asserting row-select signals (onto dummy transistors 70) at approximately the same time that reset signals RESET are deasserted, reset clock feed through (e.g., reset charge injection) may be reduced (e.g., reduced, minimized, or eliminated), as described in connection with FIG. 4.

At time $t_{11}$, sample and hold reset signals (SHR) may be asserted. When sample and hold reset signals are asserted, sample and hold circuitry 42 (FIG. 2) for each column of sensor 14 may sample and hold reset signals from each of the pixels in the currently-selected row (e.g., from the pixels in the row addressed by reset signals RESET and row-select signals ROW SELECT). If desired, the sample and hold circuitry may sample the reset signals when the sample and hold reset signals are deasserted (e.g., upon the falling edge of the SHR signals).

At time $t_{12}$, transfer signals TX may be asserted. Transfer signals TX may be asserted on the same row addressed by row-select signals ROW SELECT (at time $t_{10}$) and may activate the transfer transistors 48 of the pixels in that row. With transfer transistors 48 activated, charge accumulated by photosensor 52 may be transferred to floating diffusion storage node 45. The accumulated charge on floating diffusion storage node 45 may then be conveyed to the gate terminal of source-follower transistor 50 and output to column readout line 62 by source-follow transistor 50 (through the activated row-select transistor 46).

At time $t_{13}$, sample and hold image signals (SHS) may be asserted. When sample and hold image signals are asserted, sample and hold circuitry 42 (FIG. 2) may sample and hold image signals from each of the pixels in the currently-selected row (e.g., the voltages on floating diffusion nodes 45 which have been shifted from reset values by the accumulated image charges from photodiodes 52). If desired, sample and hold circuitry 42 may sample the image signals when the sample and hold image signals are deasserted (e.g., upon the falling edge of the SHS signals). In some embodiments, the sample and hold circuitry may use the reset signals in reducing noise from the image signals (e.g., by subtracting the reset signals from the image signals in a correlated double sampling image readout scheme).

At time $t_{14}$, row-select signals ROW SELECT may be deasserted, thereby disconnecting the selected row from column readout circuitry such as circuitry 42 of image readout circuitry 30 (FIG. 2).

Following time $t_{14}$, the signals of FIG. 7 may be applied to subsequent rows of pixels 28 in sensor 14 (e.g., to read out all of the rows of pixels 28 using an electronic rolling shutter technique).

Various embodiments have been described illustrating imaging pixels with dummy transistors that reduce reset charge injection.

An imaging system may include imaging pixels. Each imaging pixel may include a reset transistor and a dummy transistor coupled to a floating diffusion storage node. When it is desired to reset the floating diffusion node, the reset transistor may be activated by reset signals. When the reset signals are deasserted, capacitive coupling between the gate terminal of the reset transistor and the source-drain terminals of the reset transistor may lead to reset charge injection (e.g., as the reset control line voltage drops, the voltage on the floating diffusion region may also drop somewhat as a result of capacitive coupling). The dummy transistor may counteract these effects (e.g., by injecting an equal and opposite amount of charge). The dummy transistor may have both of its source-drain terminals shorted together and shorted to the floating diffusion region. As one example, dummy control signals, which may be provided by separate dummy control lines or may be provided using row-select signals, may be asserted on the dummy transistors at approximately the same time that the reset signals are deasserted. With arrangements of this type, the dummy control signals may inject an approximately equal and opposite charge onto the floating diffusion region, thereby reducing the reset charge injection caused by deasserting the reset control signals.

The foregoing is merely illustrative of the principles of this invention which can be practiced in other embodiments.

What is claimed is:

1. An image sensing pixel in an image sensor, the image sensing pixel comprising:
    a floating diffusion node;
    a reset transistor having a gate terminal and having first and second source-drain terminals, wherein the first source-drain terminal of the reset transistor is coupled to the floating diffusion node, wherein the reset transistor receives reset signals at the gate terminal, and wherein the reset transistor produces reset clock feed through; and
    a dummy transistor coupled to the floating diffusion node, wherein the dummy transistor has a gate terminal that receives an inverted version of the reset signals and at least partially offsets the reset clock feed through produced by the reset transistor.

2. The image sensing pixel defined in claim 1 wherein the dummy transistor has first and second source-drain terminals that are coupled to the floating diffusion node.

3. The image sensing pixel defined in claim 2 wherein there is a first capacitance between the gate terminal of the reset transistor and the first source-drain terminal of the reset transistor, wherein there is a second capacitance between the gate terminal of the dummy transistor and the first source-drain terminal of the dummy transistor that is coupled to the floating diffusion node, wherein there is a third capacitance between the gate terminal of the dummy transistor and the second source-drain terminal of the dummy transistor that is coupled to the floating diffusion node, and wherein the first capacitance is approximately equal to the sum of the first and second capacitances.

4. The image sensing pixel defined in claim 1 wherein there is a first parasitic capacitance between the gate terminal of the reset transistor and the first source-drain terminal of the reset transistor, wherein there is a second parasitic capacitance between the gate terminal of the dummy transistor and the floating diffusion node, and wherein the first parasitic capacitance is approximately equal to the second parasitic capacitance.

5. The image sensing pixel defined in claim 1 wherein the dummy transistor comprises first and second source-drain terminals shorted together.

6. The image sensing pixel defined in claim 1 wherein the dummy transistor comprises a body terminal, a first source-drain terminal, and a second source-drain terminal and wherein the body terminal, the first source-drain terminal, and the second source-drain terminal of the dummy transistor are shorted together.

7. The image sensing pixel defined in claim 1 wherein there is a first conductive channel between the first source-drain terminal and the second source-drain terminal of the reset transistor that is underneath the gate terminal of the reset transistor, wherein the dummy transistor comprises first and second source-drain terminals that are coupled to the floating diffusion node, and wherein there is a second conductive channel between the first source-drain terminal and the second source-drain terminal of the dummy transistor that is underneath the gate terminal of the dummy transistor.

8. The image sensing pixel defined in claim 7 wherein the first conductive channel has a first width and a first length, wherein the second conductive channel has a second width and a second length, and wherein the first width is approximately twice the second width.

9. The image sensing pixel defined in claim 8 wherein the first length is approximately equal to the second length.

10. An image sensor comprising:
    an array of image sensing pixels arranged in rows and columns, wherein each of the image sensing pixels comprises:
        a storage node;
        a reset transistor having a gate terminal and having first and second source-drain terminals, wherein the first source-drain terminal of the reset transistor is coupled to the storage node of that image sensing pixel; and
        a dummy transistor that is coupled to the storage node of that image sensing pixel, and
    circuitry that generates at least first and second control signals, wherein:
        the first control signals are routed to the gate terminals of the reset transistors in a given row of the array;
        the second control signals are routed to gate terminals of the dummy transistors in the given row of the array;
        during a reset operation, the control circuitry asserts the first control signals by taking the first control signals to a logic high level that activates the reset transistors in the given row of the array and deasserts the second control signals by taking the second control signals to a logic low level;
        at the end of the reset operation, the control circuitry:
            deasserts the first control signals by taking the first control signals to a logic low level that deactivates the reset transistors in the given row of the array such that each of the reset transistors in the given row injects at least some reset charge into its respective image sensing pixel; and
            approximately simultaneously, asserts the second control signals by taking the second control signals to a logic high level such that each of the dummy transistors in the given row injects charge into its respective image sensing pixel that at least partially offsets the reset charge injected by the reset transistor of that image sensing pixel.

11. The image sensor defined in claim 10 further comprising:
    image readout circuitry; and
    a plurality of column output lines, each of which is associated with a respective one of the columns of image sensing pixels and couples the respective one of the columns of image sensing pixels to the image readout circuitry, wherein each of the image sensing pixels further comprises:
        a row-select transistor that has a gate terminal, wherein the row-select transistor of that image sensing pixel is coupled between the storage node of that image sensing pixel and the column output line associated with that image sensing pixel.

12. The image sensor defined in claim 11 wherein the second control signals comprise row-select signals that are routed to the gate terminals of the row-select transistors.

13. The image sensor defined in claim 11 wherein the control circuitry generates third control signals that are routed to the gate terminals of the row-select transistors.

14. A method of reducing reset charge injection in an image sensing pixel in an image sensor, wherein the image sensing pixel comprises a storage node, a reset transistor having a gate terminal and having a source-drain terminal coupled to the storage node, and a dummy transistor that is coupled to the storage node, the method comprising:
    at least partially offsetting reset charge injected by the reset transistor with charge injected by the dummy transistor by, at approximately the end of a reset operation, deasserting a reset control signal on the gate terminal of the reset transistor and, approximately simultaneously, asserting a control signal on a gate terminal of the dummy transistor.

15. The method defined in claim 14 wherein the control signal comprises a row-select control signal, wherein the image sensing pixel further comprises a row-select transistor coupled between the storage node and image readout circuitry in the image sensor, and wherein asserting the row-select control signal on the gate terminal of the dummy transistor at approximately the end of the reset operation comprises asserting the row-select signal on a gate terminal of the row-select transistor.

* * * * *